(12) United States Patent
Tufano et al.

(10) Patent No.: US 6,818,142 B2
(45) Date of Patent: Nov. 16, 2004

(54) POTASSIUM HYDROGEN PEROXYMONOSULFATE SOLUTIONS

(75) Inventors: Thomas Peter Tufano, Wilmington, DE (US); Michael Brian Coxey, Elkton, MD (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/404,200

(22) Filed: Mar. 31, 2003

(65) Prior Publication Data

US 2004/0197261 A1 Oct. 7, 2004

(51) Int. Cl.$^7$ .......................... C01B 15/08; C09K 13/00; C09K 13/04; C23F 1/14; C23F 1/18
(52) U.S. Cl. .................... 216/83; 23/293 R; 216/96; 216/100; 216/105; 216/106; 216/108; 252/79.1; 252/79.2; 423/513
(58) Field of Search .............................. 423/513, 551; 23/293 R; 252/79.1, 79.2; 216/83, 96, 100, 105, 106, 108

(56) References Cited

U.S. PATENT DOCUMENTS

| 3,041,139 A | * | 6/1962 | D'Addieco et al. ............ 23/114 |
| 3,048,546 A | | 8/1962 | Lake et al. .................... 252/95 |
| 4,579,725 A | | 4/1986 | Jayawant ..................... 423/513 |
| 4,610,865 A | | 9/1986 | Reh et al. .................... 423/513 |
| 5,139,763 A | * | 8/1992 | Amini ......................... 423/513 |
| 5,607,656 A | | 3/1997 | Soicke et al. ............... 423/513 |
| 5,855,805 A | * | 1/1999 | Arabinick .................... 216/106 |
| 6,200,454 B1 | | 3/2001 | Kimizuka et al. .......... 205/471 |
| 6,255,117 B1 | | 7/2001 | Johnson ...................... 436/119 |
| 6,313,039 B1 | * | 11/2001 | Small et al. ................ 438/693 |

FOREIGN PATENT DOCUMENTS

| DE | 106331 A | 6/1974 |
| EP | 395902 A3 | 11/1990 |
| GB | 893440 | 5/1959 |

OTHER PUBLICATIONS

DuPont Specialty Chemicals, DuPont Oxone® monopersulfate compound, Technical Information Bulletin No. 290836D, 2/98, pp. 1–8, Wilmington, Delaware.

* cited by examiner

*Primary Examiner*—Wayne A. Langel

(57) ABSTRACT

A solution comprising potassium hydrogen peroxymonosulfate containing an elevated level of $KHSO_5$ and having a weight ratio of $SO_5$ to $SO_4$ of greater than 1.0:1, and its use in microetching metal substrates is disclosed.

17 Claims, No Drawings

POTASSIUM HYDROGEN PEROXYMONOSULFATE SOLUTIONS

FIELD OF THE INVENTION

This invention relates to high-strength solutions of potassium hydrogen peroxymonosulfate that are low in inert salt content, a process for their preparation, and their use in the manufacture of printed wiring boards and semiconductors.

BACKGROUND OF THE INVENTION

Trademarks are hereinafter shown in upper case.

The term "potassium monopersulfate", is commonly used in the trade, and is used herein to refer to the mixed triple salt $2KHSO_5 \cdot KHSO_4 \cdot K_2SO_4$. Potassium monopersulfate has a theoretical active oxygen content of 5.2%. All references to potassium monopersulfate herein refer to the commercially available mixed triple salt which has a typical active oxygen content of about 4.7%. It is recognized that the purity of commercially available potassium monopersulfate is about 95% to about 98% due to the presence of minor impurities, minor amounts of additives (such as an anticaking agent), and variations in manufacturing processes.

The term "$KHSO_5$", the formula of the active component in the triple salt, is used herein specifically to denote potassium hydrogen peroxymonosulfate itself.

The production of modern printed wiring boards, also known as printed circuit boards, for developing the desired electrically conductive pattern onto plastic or other substrates clad with copper foil is a complex process. In the process, electrical interconnections are made by selectively removing unwanted copper foil or adding additional copper to the substrates. The process requires careful removal of excess copper, reagents remaining from the copper deposition, powder, dust, oxides, and other debris or residuals after each construction step. It is not unusual for the process to require 100 or more individual steps because of the complexity of electrical circuitry configurations.

The removal of residual copper is termed "microetching" to emphasize the controlled nature of the action. Careful and gentle removal is required, as contrasted with energetic and bulk removal of copper by the use of highly active chemicals, sometimes under extreme conditions of temperature, pH and/or modes of application. The microetching must be combined with cleaning action for efficient and economical processing. Microetching copper is a critical step in manufacturing printed wiring board's because it ensures that plating or resist layers will adhere to the substrate each time they are applied. The rate of residual copper removal by application of the microetchant is termed "etch rate".

The microetching process involves contacting the printed wiring boards with the potassium monopersulfate solution (typically as a bath), microetching and cleaning of copper clad printed wiring board substrates, and removing the solution together with undesired residues. In the use of the microetching bath, copper is etched and the $KHSO_5$ active ingredient is consumed. Simultaneously, the $KHSO_5$ forms sulfate salts as the active oxygen is consumed, adding to the sulfate concentration formed from the potassium sulfates present in the potassium monopersulfate. Consequently, copper sulfate concentration in the bath increases, and eventually the bath must be replaced, else staining of the boards occurs and quality declines. While additional potassium monopersulfate may be added to supplement decreasing active oxygen, sulfate salts build up, limiting the useful life of the bath.

It is desirable to improve the microetching process through use of microetching solutions providing lower inert sulfate concentrations and higher weight percent active oxygen. The present invention provides such solutions.

SUMMARY OF THE INVENTION

The present invention comprises a composition comprising a solution of potassium hydrogen peroxymonosulfate having a minimum weight ratio of $SO_5$ to $SO_4$ of greater than 1.0:1.

The present invention further comprises a composition comprising a solution of potassium hydrogen peroxymonosulfate having a minimum active oxygen content, at an equivalent temperature, equal to from about 1.5 to about 5.5 times the active oxygen content of $2KHSO_5 \cdot KHSO_4 \cdot K_2SO_4$ when said $2KHSO_5 \cdot KHSO_4 \cdot K_2SO_4$ is completely dissolved.

The present invention further comprises a process for the preparation of a solution of the above potassium hydrogen peroxymonosulfate comprising a) mixing solid $2KHSO_5 \cdot KHSO_4 \cdot K_2SO_4$ with a quantity of water insufficient to completely dissolve the solid, b) mixing to form a slurry, and c) separating undissolved solids to obtain the solution.

The present invention further comprises an improved method of microetching a surface wherein the improvement comprises contacting the surface to be etched with a solution of potassium hydrogen peroxymonosulfate having a minimum ratio of $SO_5$ to $SO_4$ of greater than 1.0:1.

DETAILED DESCRIPTION OF THE INVENTION

The present invention comprises a high-strength or concentrated aqueous solution of $KHSO_5$ prepared by partially dissolving potassium monopersulfate in water, while selectively dissolving more of the $KHSO_5$ component together with some $KHSO_4$ and relatively little $K_2SO_4$. Thus the solutions of the present invention have a higher concentration of $KHSO_5$ than prior art potassium monopersulfate solutions.

Commercially available prior art potassium monopersulfate products contain typically about 4.7% active oxygen. Commercial potassium monopersulfate usually contains anti-caking agents, such as magnesium carbonate, and small amounts of process impurities. The triple salt potassium monopersulfate is available commercially as the active ingredient in OXONE monopersulfate compound available from E. I. du Pont de Nemours and Company, Wilmington Del. OXONE is a stable, solid, water-soluble, non-chlorine-containing oxidizing agent with multiple uses. Potassium monopersulfate is typically dissolved completely in water and used as a freshly-prepared solution or alternatively is used in its original granular form.

Hereinafter all solubilities and concentrations are provided in grams of solid dissolved in 100 g of water and all concentrations as weight percent or g/100 g solution. As an example for the approximate interconversion, 10 g solute/ 100 g water corresponds to 100×10/(10+100) or 9.1 weight percent since the specific gravity of water approximates 1.0 at or near room temperature. The solubility of the potassium monopersulfate triple salt in water at 20° C. is about 30 g/100 g water (more detail at varying temperatures is shown in Table 1 below), providing an active oxygen concentration of 1.0–1.1%. The term "complete solution" is used herein to mean prior art potassium monopersulfate solutions wherein the salts are completely (100%) dissolved. Complete solutions have more limited stablity than the anhydrous triple salt in granulated form, losing about 3% active oxygen/month, compared with a loss of less than about 1% active oxygen/month for solid potassium monopersulfate. This stability of the potassium monopersulfate solutions is sufficient for uses where the solution is to be used within a few weeks, depending upon storage temperature.

TABLE 1

Aqueous solubility values versus temperature (g/100 g water).

| Temperature | Triple Salt* | $KHSO_5$ | $KHSO_4$ | $K_2SO_4$ |
|---|---|---|---|---|
| 0° C. | 11 | 51 | 37 | 8 |
| 10° C. | 21 | 61 | 45 | 10 |
| 20° C. | 30 | 72 | 53 | 11 |
| 30° C. | 34 | 83 | 61 | 13 |
| 40° C. | 42 | 93 | 70 | 14 |
| 50° C. | 44 | 104 | 79 | 16 |

*Commercially available $2KHSO_5 \cdot KHSO_4 \cdot K_2SO_4$

The potassium hydrogen peroxymonosulfate solutions of the present invention referred to herein as "high-strength" or "concentrated", have a higher level of $KHSO_5$ compared to prior art complete solutions. They have an active oxygen content that is from about 1.5 to about 5.5 times the active oxygen content of such prior art complete solutions and a higher $SO_5/SO_4$ weight ratio than such prior art complete solutions. The prior art solutions used herein, termed complete solutions, were prepared from the OXONE brand commercially available triple salt $2KHSO_5 \cdot KHSO_4 \cdot K_2SO_4$.

The high-strength solution of the present invention is prepared by slurrying solid potassium monopersulfate (e.g., OXONE monopersulfate compound) with a limited amount of water. The amount of water used is insufficient to completely dissolve the solid. The resultant slurry is stirred and equilibrated at the selected temperature for a length of time sufficient to dissolve the maximum concentration of the $KHSO_5$ active component. Since the $KHSO_5$ component is the most soluble (see Table 1), most of the potassium sulfate and some of the potassium hydrogen sulfate (the inert stabilizing sulfates in potassium monopersulfate) remain undissolved. Undissolved solids are then separated from the slurry by any of a number of suitable means, including but not limited to filtration, centrifugation, sedimentation and the like. The clear filtrate or decanted liquid is the high-strength potassium hydrogen peroxymonosulfate solution of the present, invention, and is stored in suitable acid- and oxidation-resistant containers, e.g., high density poly (ethylene), high density poly(propylene) and stainless steel for future use.

In the preparation of the slurry, high quality water is required, with low concentrations of metal ions and low levels of oxidizable organic and inorganic contaminants. Certain metal ions catalyze the decomposition of $KHSO_5$ in aqueous solutions. Deionized water, essentially free of other contaminants is preferred and strongly recommended.

The amount of potassium monopersulfate used for each 100 g water varies with the temperature at which the undissolved residue will be separated from the slurry and the filtrate used. The maximum amount of potassium monopersulfate is an amount such that, after the undissolved sediment is removed, at least 99% of the active oxygen content of the potassium monopersulfate is retained in solution. The minimum amount of potassium monopersulfate used for each 100 g of water is not less than the amount of potassium monopersulfate that will provide a filtrate containing 1.5 times the active oxygen found for the complete solution at the same temperature. This range of ratios of potassium monopersulfate to water yields solutions with active oxygen levels from about 1.5 times (1:5:1) to as much as 5.5 times (5:5:1) the active oxygen content of a complete solution of the potassium monopersulfate over the temperature range of 0° C. to about 40° C. as shown below in Table 3. Preparation of the high-strength solutions of the present invention at temperatures at or below 0° C. and above 40° C. is not considered practical for commercial use. The data in Table 3 provides information on the minimum and maximum amounts of potassium monopersulfate to be used with 100 g water to obtain compositions of the present invention. The minimum amounts represent grams of potassium monopersulfate to be used with 100 g water, at the specified temperature, to provide compositions having 1.5 times the active oxygen content of a complete solution of potassium monopersulfate. The maximum amounts represent grams potassium monopersulfate to be used with 100 g water, at the specified temperature, to provide compositions having up to 5.5 times the active oxygen content of a complete solution of potassium monopersulfate.

Active oxygen content higher in the range is preferred. The minimum active oxygen content is from about 1.5 to about 2.5, preferably to about 2.7, and more preferably to about 3.4, times the active oxygen content of a complete solution. Increasing the maximum ratio of potassium monopersulfate to water beyond the above upper limit listed in Table 3 for a specific temperature results in undesirable loss of $KHSO_5$ in the residue without increasing the active oxygen concentration. Decreasing the minimum ratio of potassium monopersulfate to water below the lower limit listed in Table 3 for a specific temperature provides little advantage over the complete solution.

As the weight of potassium monopersulfate per 100 grams of water is increased above the desired level at a given temperature, undissolved $KHSO_5$ is lost in the removed solids. As the weight of potassium monopersulfate is decreased below the desired level at a given temperature, the weight percent active oxygen in the filtered solution decreases. Compared with the complete solution, the high-strength or concentrated solution of the present invention has higher $KHSO_5$ concentration and thus higher active oxygen concentration. On an active oxygen basis, the high-strength or concentrated solution of the present invention has a lower inert sulfate salt concentration.

The high-strength potassium hydrogen peroxymonosulfate solutions of the present invention have stability comparable to prior art complete solutions. Table 2 below shows the stability of the active oxygen versus time at ambient and 35° C. for the filtrates of Example 1. The concentrated solutions of the present invention, from which sulfate salts have been removed, are as stable as the complete solutions of the prior art.

The high-strength solutions of the present invention have a higher $SO_5/SO_4$ weight ratio than the complete solutions of the prior art. This ratio is measured or calculated after undissolved sulfate salts have been removed, but before any addition of adjuvants. Dilution does not affect this ratio. The $SO_5/SO_4$ weight ratio for the solid potassium monopersulfate and all complete solutions prepared from commercially available potassium monopersulfate in the prior art is approximately 0.9:1.0. This is slightly lower than the calculated theoretical value due to the presence of impuities and additives and manufacturing process variations. Since, in the high-strength solutions of the present invention, undissolved sulfate salts are removed, the $SO_5/SO_4$ weight ratios are significantly higher, ranging from about 1.0:1 at the minimum potassium monopersulfate level at 0° C. to about 1.6:1 at the maximum potassium monopersulfate level at 40° C. $SO_5/SO_4$ weight ratios are shown in Table 4.

Additional adjuvants may be dissolved in the solution of the present invention after the above separation from undissolved solids, or at the point of use to meet specific end-product requirements. Adjuvants well known to those skilled in the art are selected with appropriate solubility and stability in the highly acidic and oxidative solution. Types and examples of adjuvants suitable for use in the solutions of the present invention when used as microetch solutions include, but are not limited to, the following examples: mineral acids such as sulfuric, phosphoric and nitric, (but not hydrochloric due to the potential for hazardous chlorine generation); $C_1$ to $C_4$ organic acids; surfactants to improve wettability (such as nonionic, anionic, cationic and amphoteric surfactants); stabilizers such as sodium phenolsulfonate; and etch rate modifiers such as nitrogen-containing heterocyclic compounds such as azole compounds, e.g., benzotriazole.

The concentrated $KHSO_5$ solutions of the present invention are advantageous in several end uses. An example is the preparation of microetch concentrates for use in the manufacture of printed wiring boards. In this use, the high-strength concentrate can be used as is or diluted as necessary. The high-strength concentrate provides a desirable combination of higher active oxygen concentration and lower sulfate level.

The present invention further comprises an improved method of microetching a surface wherein the improvement comprises contacting the surface with the potassium hydrogen peroxymonosulfate solution of the present invention having a minimum ratio of $SO_5$ to $SO_4$ of greater than 1.0:1. This improved method is useful for etching metal surfaces, for example in processes to etch printed wiring boards or semiconductors. The higher active oxygen concentrations of the solutions of the present invention result in a higher metal loading capacity in such processes when used as microetching solutions. Also, the useful life of the solution when used as a microetching bath is extended in time due to the lower initial $SO_4$ content of the solution. In particular, this improved method is useful in etching printed wiring boards or semiconductors clad with copper or copper alloy wherein the etching solution is used to selectively remove unwanted copper or to modify the surface topography. The solutions of the present invention have a copper loading capacity of at least 15 g per kg solution, preferably at least 17 g per kg solution, and more preferably 20 g per kg solution. Bath activity and throughput are increased, and bath life is extended since sulfate concentrations are substantially reduced, as shown in Examples 12 and 13. For the solutions of the present invention compared to prior art complete solutions, bath life is increased 1.5 times longer, preferably 2 times longer, and more preferably 2.5 times longer.

$KHSO_5$ solution provides a superior copper topography when used as microetchant and cleaner in printed wiring board manufacture. The topography is characterized by a roughened metallurgical surface, thereby providing a sufficient number of keying sites to ensure good adhesion for plating and resist lamination. The pH of the $KHSO_5$ can be lowered and surface texture can be varied by the addition of a mineral acid to the solution. Phosphoric acid produces a relatively smoother topography whereas sulfuric acid increases roughness. Typically, about 1–5 percent mineral acid by volume of $KHSO_5$ solution is used. $KHSO_5$ is also effective at lower temperatures than other microetchants. For example, $KHSO_5$ is effective at about 24°–32° C. whereas hydrogen peroxide/sulfuric acid solutions require temperatures of about 46°–54° C.

The copper or copper alloy clad substrates subjected to microetching comprise any plies of plastic, fiber glass or other material to which copper foil is adhered or upon which copper is deposited, electrolessly or electrolytically. The substrates can be single or multiple plies in the form of composite or layered structures such as laminates and other materials. Such copper clad substrates and laminates are conventional in the printed wiring board art. The substrates may contain through-holes on the walls of which copper has been deposited for electrical connection. Single laminates or multilayer boards must be microetched and cleaned, usually numerous times during printed wiring board fabrication. Application of the microetching and cleaning solution is usually by spraying or immersion of copper clad substrates in a bath formed with the etching solution, and the solution can be applied in any other convenient manner.

The high-strength potassium hydrogen peroxymonosulfate solutions of the present invention are also useful as a component of a chemical mechanical polishing slurry. Such slurries are used for polishing metal layers and thin films associated with semiconductor manufacture.

Typical semiconductor integrated circuits are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and sometimes a third and subsequent levels of metallization. Interlevel dielectrics such as doped and undoped silicon dioxide ($SiO_2$), are used to electrically isolate the different levels of metallization in a silicon substrate or well. The electrical connections between different interconnection levels are made through the use of metallized vias. Metal contacts are used to form electrical connections between interconnection levels and devices formed in a well.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The slurry composition is an important factor in the chemical mechanical polishing step. Depending on the choice of the oxidizing agent, the abrasive, and other useful additives, the polishing slurry can be tailored to provide effective polishing to metal layers at desired polishing rates while minimizing surface imperfections, defects, corrosion and erosion. Furthermore, the polishing slurry may be used to provide controlled polishing selectivities to other thin-film materials used in current integrated circuit technology such as titanium, titanium nitride and the like. The concentrated solution of the present invention is an excellent oxidizing agent in such a slurry.

The solution of the present invention is also useful as an auxiliary oxidant or water shock treatment for pools, spas, and other recreational and ornamental waters, including fountains, reflecting pools, ornamental ponds, and the like. It is used to reduce the non-microbial waste content and restore the sparkle and clarity of such bodies of water. It does so without forming the irritating and malodorous chloramines associated with chlorinating products such as calcium hypochlorite. The solutions of the present invention are used in conjunction with EPA-registered sanitizers. In contrast to chlorine bleaches such as calcium hypochlorite, the solution of the present invention provides oxidation without undesirable side-effects such as bleaching or fading of vinyl liners, painted surfaces, or swimsuit fabrics. Other uses include the active bleach component in other cleaning compositions, a paper repulping aid for the destruction of wet strength resins, and an oxidizer in antimicrobial compositions.

Potassium monopersulfate compound may be shipped in its most stable solid form, then converted to the high-strength solution of the present invention for "just in time" delivery to the use location.

Equipment and Materials

OXONE monopersulfate compound as used in the Examples is available from E. I. du Pont de Nemours and Company, Wilmington, Del.

Test Methods

Active Oxygen Measurement

In all examples, active oxygen concentrations are expressed in weight % and are determined by standard iodometric titrabon as described in the "OXONE Monopersulfate Compound Technical Information" Bulletin, No. H42434-5, dated April 2000, published by E. I. du Pont de Nemours and Company. Briefly, a weighed aliquot of the solution to be analyzed is diluted with cold deionized water, acidified, treated with potassium iodide, and titrated with standardized 0.1N sodium thiosufate reagent to an endpoint visualized by a starch indicator. The active oxygen (AO) content is calculated as follows:

% AO=0.8(Volume of titrant, $mL$)(Normality of titrant)/(Sample Weight, $g$)

Equivalently, the % $KHSO_5$ concentration may be calculated by:

% $KHSO_5$=% AO/0.105.

EXAMPLES

The following examples are presented to demonstrate the invention, but are not intended to be limiting.

Example 1

OXONE brand potassium monopersulfate (104 g, 4.52% active oxygen as the solid) was slurried with 52 g of deionized water (equivalent to 200 g OXONE per 100 g water). The slurry was stirred overnight at ambient room temperature (22° C.+/−2° C.) and then filtered through a coarse glass filter funnel to remove undissolved potassium sulfate and bisulfate salts. The clear filtrate was analytically characterized as follows:

| % active oxygen | 2.98 | % $KHSO_5$ | 28.4 |
|---|---|---|---|
| % $KHSO_4$ | 13.5 | pH | 0.9 |
| Total Dissolved Solids (TDS), % | | 49.4 | |
| Weight Ratio, $SO_5$/Total $SO_4$ | | 1.5:1 | |

The recovery of the $KHSO_5$ active component was 99.0% complete in this example. The resulting solution was storage stable for many weeks with only minor losses in active oxygen content, comparable to prior art conventional complete solutions, as shown in Table 2.

TABLE 2

Stability of solutions.

% Active Oxygen Remaining After Period (based on initial content)

| | Conventional Solution* | | High-strength Solution* | |
|---|---|---|---|---|
| Time | Room Temperature** | 35° C. | Room Temperature** | 35° C. |
| Initial (0 days) | 100 | 100 | 100 | 100 |
| 1 week | 100 | 93 | 98 | 96 |
| 2 weeks | 99 | 87 | 97 | 93 |
| 1 month | 96 | 80 | 95 | 85 |
| 2 months | 94 | 70 | 91 | 68 |

*Conventional complete solutions were prepared by dissolving 12.6 g OXONE brand potassium monopersulfate in 100 g deionized water at room temperature (11.2 wt. %, 0.51% active oxygen content). High-strength potassium hydrogen peroxymonosulfate solutions of the present invention were prepared as described in Example 1.
**Room temperature was 22° C. +/− 2° C.

The data in Table 2 showed that conventional complete solutions and the high-strength solutions of the present invention had approximately the same stability at room temperature and an elevated temperature of 35° C. Stability data was measured for a period of up to two months, a practical limit for the storage of all potassium monopersulfate solutions at room temperature since loss of 10% or more of the active oxygen is undesirable.

Examples 2–11

These examples illustrated preparation of high-strength potassium hydrogen peroxymonosulfate solutions of the present invention at a range of useful concentrations and over a wide range in temperature. Weighed amounts of OXONE brand potassium monopersulfate (4.52% active oxygen as the solid) as specified in Table 3 were slurried with 100 grams of deionized water. The slurries were stirred at constant temperature (water bath) as indicated in Table 3. Each slurry was equilibrated at the specified temperature for at least three hours and no longer than 24 hours. Each slurry was filtered as described in Example 1 yielding a clear filtrate in each case. The high-strength solutions thus obtained were analytically as characterized as shown in Table 3.

Comparative Examples A–E

These examples illustrated preparation of complete solutions of the prior art. Weighed amounts of OXONE brand potassium monopersulfate (4.52% active oxygen as the solid) as specified in Table 3 were dissolved in 100 grams of deionized water at the specified temperature. In each case, no excess solid remained undissolved. The values in Table 3 represent the maximum conventional solubility of potassium monopersulfate in water. The % active oxygen content for each solution is given in Table 3. In every case, the weight ratio of $SO_5$ to total $SO_4$ is the same as that of solid state potassium monopersulfate and is equal to 0.9.

TABLE 3

| Example | Temp, °C. | g OXONE[1] Per 100 g H₂O | Active Oxygen Weight % | Multiple[2] |
|---|---|---|---|---|
| 2 | 0 | 18 | 0.69 | |
| 3 | 0 | 123 | 2.49 | 5.5 |
| Comp.A | 0 | 11 | 0.45 | |
| 4 | 10 | 35 | 1.17 | |
| 5 | 10 | 142 | 2.65 | 3.4 |
| Comp.B | 10 | 21 | 0.78 | |
| 6 | 20 | 52 | 1.55 | |
| 7 | 20 | 165 | 2.82 | 2.7 |
| Comp.C | 20 | 30 | 1.04 | |
| 8 | 30[3] | 62 | 1.73 | |
| 9 | 30[3] | 221 | 3.11 | 2.7 |
| Comp.D | 30[3] | 34 | 1.15 | |
| 10 | 40[3] | 80 | 2.01 | |
| 11 | 40[3] | 291 | 3.36 | 2.5 |
| Comp.E | 40[3] | 42 | 1.34 | |

[1]OXONE brand potassium monopersulfate
[2]Multiple is percent active oxygen of Example divided by percent active oxygen of Comparative Example listed in same box of Table.
[3]If elevated filtrate temperature is not maintained for the 30° C. and 40° C. examples, solute will precipitate and this may reduce the active oxygen concentration, depending on which salt(s) comes out of solution.

In Table 3, Examples 2, 4, 6, 8 and 10 represented for the temperature listed the minimum ratio of potassium monopersulfate to water (grams potassium monopersulfate to 100 g water) in the compositons of the present invention. The minimum ratio provided a filtrate having about 1.5 times more active oxygen, at the same temperature, than the complete solution of the prior art represented by Comparative Examples A–E. The multiple for the Comparative Example A vs. Example 2, Comparative Example B vs. Example 4, Comparative Example C vs. Example 6, Comparative Example D vs. Example 8, and Comparative Example E vs. Example 10 was 1.5.

In Table 3, Examples 3, 5, 7, 9 and 11 represented for the temperature listed the maximum ratio of potassium monopersulfate to water in the compositions of the present invention. This was the ratio (grams potassium monopersulfate per 100 g water) such that the loss of undissolved $KHSO_5$ in the filtrate was 0%. Use of additional potassium monopersulfate resulted in loss of $KHSO_5$ in the separation step. Use of these ratios of potassium monopersulfate to water provided solutions having from about 2.5 times up to about 5.5 times more active oxygen than in the Comparative Examples A–E (shown as multiple in Table 3).

Table 3 shows that, within the temperature range 0°–40° C., active oxygen concentrations of the solutions of the present invention are 2.5 to 5.5 times higher than the conventional complete solution. Additionally, compared with the complete solution, inert sulfate concentrations of the solutions of the present invention are lower corresponding to the mixed sulfate salts removed by filtration. In commercial practice, operation at 0° and 40° C. is not anticipated. $SO_5/SO_4$ ratios for examples are shown in Table 4.

TABLE 4

| Ex.# | Temp | % KHSO₅ | % KHSO₄ | % TDS[1] | % residual sulfate, (mainly K₂SO₄)[2] | SO₅/SO₄[3] |
|---|---|---|---|---|---|---|
| Examples with minimum potassium monopersulfate | | | | | | |
| 2 | 0° C. | 6.5 | 2.9 | 14.8 | 5.4 | 1.0:1 |
| 6 | 20° C. | 15.6 | 7.2 | 30.2 | 7.4 | 1.3:1 |
| 10 | 40° C. | 20.5 | 9.4 | 40.0 | 10.1 | 1.2:1 |
| Examples with maximum potassium monopersulfate | | | | | | |
| 3 | 0° C. | 23.5 | 11.1 | 41.6 | 7.0 | 1.5:1 |
| 7 | 20° C. | 27.5 | 11.5 | 47.6 | 8.6 | 1.6:1 |
| 11 | 40° C. | 32.9 | 14.4 | 57.1 | 9.8 | 1.6:1 |
| Comparative Example (complete solution) | | | | | | |
| C | 20° C. | 9.9 | 5.6 | 23.1 | 7.6 | 0.9:1[4] |

[1]TDS: total dissolved solids.
[2]Calculated value by difference TDS - (% KHSO₅ + % KHSO₄); actual values for K₂SO₄ are slightly less than shown due to small amounts of additives and impurities in the potassium monopersulfate.
[3]Weight ratio of SO₅ to total SO₄.
[4]SO₅/SO₄ ratio for conventional total solutions at all temperatures is dictated by the solid state composition of potassium monopersulfate.

Example 12

This example illustrated how a high-strength solution of the present invention was used to make-up a copper microetch bath with lower inert sulfate content and higher copper loading capacity. A high-strength potassium hydrogen peroxymonosulfate solution was prepared as described in Example 1. Fifty grams of a microetch bath was prepared by diluting 15.3 g of the high-strength solution with 34.7 g deionized water, thus producing a solution with 0.91% active oxygen and 4.1% sulfate (as $SO_4$). The microetch solution was equilibrated to 30° C. with stirring. A pre-weighed, 2.5-inch square (40.3 cm³) copper-clad substrate was placed in the bath and microetched for a total of 40 minutes, until the point when copper sulfate was first observed to precipitate. At this point the substrate was removed, rinsed, dried and re-weighed. A total of 1.216 g of Cu was removed, indicating a copper loading capacity of 24.3 g per 1000 g of starting microetch solution. The average etch rate during the entire experiment was 34.8 microinches/min (0.88 micrometers/min) with an initial etch rate of 45.3 microinches/min (1.15 micrometers/min). The resultant copper surface exhibited enhanced roughness and a characteristic "matte pink" appearance. These results are summarized in Table 5 with the results from Comparative Example F, and showed that by using a high-strength potassium hydrogen peroxymonosulfate solution of the present invention to make-up a copper microetch bath, two-fold longer bath life and 64% higher copper loading capacity was achieved due to the lower sulfate load.

Comparative Example F

This example illustrated the comparative characteristics of a microetch bath of a conventional complete solution of potassium monopersulfate solution. Fifty grams of a microetch bath was prepared by dissolving 10.1 g of OXONE brand potassium monopersulfate solution (4.52% active oxygen as solid) in 39.9 g deionized water, thus producing a solution with 0.91% active oxygen and 6.4% sulfate (as $SO_4$). The microetch solution was equilibrated to 30° C. with stirring. A pre-weighed, 2.5-inch square (40.3 cm²) copper-clad substrate was placed in the bath and microetched for a total of 20 minutes, until the point when copper sulfate was first observed to precipitate. At this point the substrate was removed, rinsed, dried and re-weighed. A total of 0.74 g of Cu was removed, indicating a copper loading capacity of 14.8 g per 1000 g of starting microetch solution. The average etch rate during the entire experiment was 42.4 microinches/min (1.08 micrometers/min.) with an initial etch rate of 32.3 microinches/min. (0.82 micrometers/min.). The resultant copper surface exhibited enhanced roughness and a characteristic "matte pink" appearance. These results are summarized in Table 5.

TABLE 5

Microetching Tests.

| Characteristic | Example 12 | Comparative Example F |
|---|---|---|
| $SO_5/SO_4$ weight ratio | 1.5 | 0.9 |
| Time to precipitate $CuSO_4$ | 40 min | 20 min |
| Cu Loading Capacity | 24.3 g Cu/kg solution | 14.8 g Cu/kg solution |

Table 5 compares Example 12 with Comparative Example F. The comparison showed that, by using the high-strength solution of the present invention of Example 12, a copper microetch bath was prepared that provided a two-fold longer bath life and 64% higher copper loading capacity. These differences were due to the higher $SO_5/SO_4$ weight ratio in Example 12 and indicated a significant improvement in bath capacity.

What is claimed is:

1. A composition comprising a solution of potassium hydrogen peroxymonosulfate having a minimum weight ratio of $SO_5$ to $SO_4$ of greater than 1.0:1, and having a minimum active oxygen content, at an equivalent temperature, equal to from about 1.5 to about 5.5 times the active oxygen content of $2KHSO_5.KHSO_4.K_2SO_4$ when said $2KHSO_2.KHSO_4.K_2SO_4$ is completely dissolved, said composition having improved metal loading capacity for microetching of a surface.

2. The composition of claim 1 having a minimum ratio of $SO_5$ to $SO_4$ of greater than 1.2:1.

3. The composition of claim 1 having a minimum ratio of $SO_5$ to $SO_4$ of greater than 1.3:1.

4. The composition of claim 1 wherein the minimum active oxygen content is from about 1.5 to about 3.4 times the active oxygen content of $2KHSO_5.KHSO_4.K_2SO_4$ when said $2KHSO_5.KHSO_4.K_2SO_4$ is completely dissolved.

5. The composition of claim 1 further comprising an adjuvant selected from the group consisting of a mineral acid which is sulfuric acid, phosphoric acid or nitric acid, a $C_1$ to $C_4$ organic acid, a surfactant, a stabilizer, and an etch rate modifier.

6. The composition of claim 1 further comprising a microetching solution.

7. The composition of claim 1 further comprising a chemical mechanical polishing slurry.

8. A process for the preparation of a solution of potassium hydrogen peroxymonosulfate of claim 1 comprising a) mixing solid $2KHSO_5.KHSO_4.K_2SO_4$ with a quantity of water insufficient to completely dissolve the solid, b) mixing to form an equlibrated slurry, and c) separating undissolved solids to obtain a solution containing a lower level of inert sulfate content than in solutions when $2KHSO_5.KHSO_4.K_2SO_4$ is completely dissolved.

9. Process of claim 8 wherein at least 52 g salt is mixed with 100 g water at 20° C.

10. Process of claim 8 wherein the water is deionized water.

11. Process of claim 8 further comprising, after separating undissolved solids, adding an adjuvant selected from the group consisting of a mineral acid which is sulfuric acid, phosphoric acid, or nitric acid, a $C_1$ to $C_4$ organic acid, a surfactant, a stabilizer, and an etch rate modifier.

12. An improved method of microetching a surface wherein the improvement comprises contacting the surface to be etched with a solution of potassium hydrogen peroxymonosulfate having a minimum ratio of $SO_5$ to $SO_4$ of greater than 1.0:1.

13. The method of claim 12 wherein the solution has a minimum ratio of $SO_5$ to $SO_4$ of greater than 1.5:1.

14. The method of claim 12 wherein the surface to be etched is a metal.

15. The method of claim 12 wherein the surface to be etched is a metal coated semiconductor or printed wiring board.

16. The method of claim 12 wherein the surface to be etched is clad with copper or copper alloy.

17. The method of claim 12 wherein the solution has a copper loading capacity of at least 15 g copper per kg solution.

* * * * *